(12) United States Patent
Ruan

(10) Patent No.: US 8,111,379 B2
(45) Date of Patent: Feb. 7, 2012

(54) AUTOMATED DETERMINATION OF HEIGHT AND TILT OF A SUBSTRATE SURFACE WITHIN A LITHOGRAPHY SYSTEM

(75) Inventor: Junru Ruan, Albany, NY (US)

(73) Assignee: The Research Foundation of State University of New York, Albany, NY (US)

( * ) Notice: Subject to any disclaimer, the term of this patent is extended or adjusted under 35 U.S.C. 154(b) by 925 days.

(21) Appl. No.: 12/127,036

(22) Filed: May 27, 2008

(65) Prior Publication Data
US 2009/0296057 A1    Dec. 3, 2009

(51) Int. Cl.
   G03B 27/54    (2006.01)
   G03B 27/52    (2006.01)

(52) U.S. Cl. .......................................... 355/67; 355/55

(58) Field of Classification Search .................. 355/53, 355/67, 55, 72; 356/150
   See application file for complete search history.

(56) References Cited

U.S. PATENT DOCUMENTS

| | | | |
|---|---|---|---|
| 4,504,144 A * | 3/1985 | Trost | 356/150 |
| 5,436,721 A | 7/1995 | Pence et al. | |
| 5,747,814 A | 5/1998 | Gordon et al. | |
| 5,859,439 A | 1/1999 | Nam et al. | |
| 5,894,132 A | 4/1999 | Nakasuji et al. | |
| 6,884,554 B2 | 4/2005 | Chen | |
| 7,072,024 B2 | 7/2006 | Novak | |
| 7,265,364 B2 | 9/2007 | Teunissen et al. | |
| 2004/0070772 A1 | 4/2004 | Shchegrov et al. | |
| 2008/0062385 A1 | 3/2008 | Klaassen | |

OTHER PUBLICATIONS

International Search Report and the Written Opinion of the International Searching Authority for International Application No. PCT/US2009/045239, dated Jan. 12, 2010.

* cited by examiner

*Primary Examiner* — Peter B Kim
(74) *Attorney, Agent, or Firm* — Kevin P. Radigan, Esq.; Heslin Rothenberg Farley & Mesiti P.C.

(57) ABSTRACT

Method and apparatus are provided for automated determination and adjustment of height and tilt of a substrate surface within a lithography system. The method includes: directing a beam of light onto the substrate surface, which reflects off the substrate surface as a reflected beam; optically splitting the reflected beam into a first reflected beam portion and a second reflected beam portion; impinging the first reflected beam portion onto a first detector plane of a first optical detector to generate intensity data, and impinging the second reflected beam portion onto a second detector plane of a second optical detector to generate intensity data, and utilizing the generated data in determining height and tilt of the substrate surface relative to a nominal writing plane of the lithography system. Responsive to the determination, focus or tilt of the system's writing beam, or position of the substrate surface within the system, is adjusted.

19 Claims, 10 Drawing Sheets

US 8,111,379 B2

AUTOMATED DETERMINATION OF HEIGHT AND TILT OF A SUBSTRATE SURFACE WITHIN A LITHOGRAPHY SYSTEM

TECHNICAL FIELD

The present invention relates in general to lithography systems, and more particularly, to monitoring methods and apparatuses for automatically determining height and tilt of a substrate surface positioned within the lithography system for patterning thereof.

BACKGROUND OF THE INVENTION

A lithography system is a system that applies a desired pattern onto a target portion of a substrate surface, for example, in the manufacture of an integrated circuit (IC). A lithography system employs a patterning structure, which is alternatively referred to as a mask or a reticle, that is used to generate a circuit pattern corresponding to an individual layer of the IC, and its pattern is imaged onto a target portion (e.g., including part of, one or several dies) on the substrate surface or wafer. The substrate surface has a layer of radiation-sensitive material (resist) disposed thereon. The patterned substrate is then developed, and one layer of the circuit pattern appears. When repeated a number of times, the process results in a fully patterned integrated circuit substrate.

Lithography systems, such as electron beam lithography systems, have a limited depth of focus. Thus, variation of height of the writing surface may result in out-of-focus imaging, which may induce control errors. The height of a substrate surface within a lithography system may vary across the substrate. Not only are there variations in substrate thickness, but also there may be particles between the substrate and its support stage, causing the substrate to deform when held in the stage. If these height variations are not corrected, the surface of the substrate being exposed by the writing beam (for example, the electron writing beam), may be beyond the depth of focus of the optical system, causing blurring of the image of the projected pattern. The substrate may also be tilted with respect to the lithography system, and more particularly, with respect to a nominal or ideal writing plane of the lithography system. This tilt may also appear as an optical de-focusing that varies across the substrate surface.

Various approaches have been disclosed in the art for monitoring and measuring height and/or tilt variations. For example, reference U.S. Pat. Nos. 5,894,132; 6,884,554; 7,072,024; and 7,265,364. Although certain ones of the monitoring approaches described in these Letters Patents do provide a mechanism for ascertaining tilt of a substrate within a lithography system, the approaches are generally complex and/or difficult to align and calibrate, and may have a lower sensitivity than desired, or overly rely on exact positioning of the support stage holding the substrate.

SUMMARY OF THE INVENTION

The shortcomings of the prior art are overcome and additional advantages are provided by the present invention, which in one aspect, comprises a method of facilitating operation of a lithography system. The method includes: directing a beam of light onto a substrate surface, the substrate surfacing being positioned within the lithography system for patterning thereof, and the beam of light reflecting off the substrate surface as a reflected beam; optically splitting the reflected beam into at least a first reflected beam portion and a second reflected beam portion; impinging the first reflected beam portion onto a first detector plane of a first optical detector to generate intensity data therefrom, and impinging the second reflected beam portion onto a second detector plane of a second optical detector to generate intensity data therefrom; and utilizing the intensity data generated from the first reflected beam portion and the intensity data generated from the second reflected beam portion in determining at least one of height or tilt of the substrate surface relative to a nominal writing plane of the lithography system.

In another aspect, a monitoring apparatus is provided for a lithography system. The monitoring apparatus includes an optical beam splitter, a first optical detector, a second optical detector, and a processor. The optical beam splitter is positioned to optically split a reflected beam reflecting off a substrate surface positioned within the lithography system. The reflected beam is produced by a beam of light reflecting off the substrate surface, and the optical beam splitter splits the reflected beam into at least a first reflected beam portion and a second reflected beam portion. The first reflected beam portion impinges onto a first detector plane of the first optical detector to generate intensity data therefrom, and the second reflected beam portion impinges onto a second detector plane of the second optical detector to generate intensity data therefrom. The processor is coupled to the first optical detector and the second optical detector for receiving the generated intensity data, and for determining therefrom at least one of height or tilt of the substrate surface relative to a nominal writing plane of the lithography system.

In yet another aspect, a lithography system is provided which includes a patterning subsystem to project a writing beam onto a substrate surface for patterning thereof, and a support stage configured to support the substrate with the substrate surface thereof exposed to the writing beam. The lithography system further includes a monitoring apparatus for monitoring at least one of height or tilt of the substrate surface relative to a nominal writing plane of the lithography system. The monitoring apparatus includes an optical beam splitter, a first optical detector, a second optical detector, and a processor. The optical beam splitter is positioned to optically split a reflected beam reflecting off the substrate surface, the reflected beam being produced by a beam of light reflecting off the substrate surface, and the optical beam splitter splitting the reflected beam into at least a first reflected beam portion and a second reflected beam portion. The first reflected beam portion impinges onto a first detector plane of the first optical detector to generate intensity data therefrom, and the second reflected beam portion impinges onto a second detector plane of the second optical detector to generate intensity data therefrom. The processor is coupled to the first optical detector and the second optical detector for receiving the intensity data generated from the first reflected beam portion and the intensity data generated from the second reflected beam portion, and for determining therefrom at least one of height or tilt of the substrate surface relative to a nominal writing plane of the lithography system.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
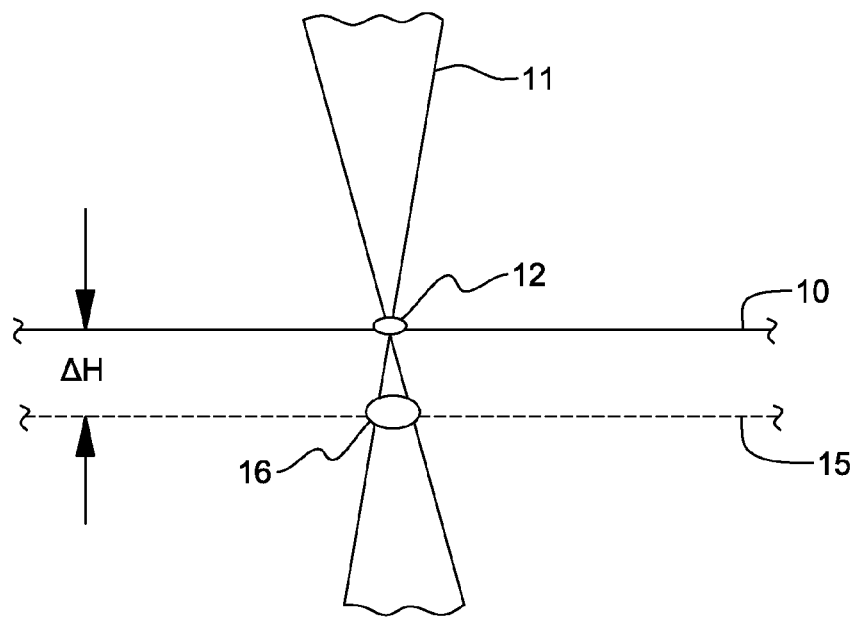
FIG. 1 illustrates an example of a substrate surface at a height offset from a nominal or ideal writing plane of a lithography system, wherein the height offset is to be detected, in accordance with an aspect of the present invention.

Commonly available lithography systems (such as the electron beam lithography systems offered by ASML Netherlands B.V. of Veldhoven, The Netherlands, Raith GmbH, Dortmund, Germany, JEOL Ltd., Tokyo, Japan, or Vistec Semiconductor Systems, Watervliet, N.Y., USA), have limited depth of focus. FIG. 1 illustrates this problem, wherein a lithography system has a nominal (or ideal) writing plane 10 at which the system's writing beam 11 produces an in-focus pattern 12. Due to its limited depth of focus, however, the writing beam produces an out-of-focus pattern 16 on a substrate surface 15 offset a height ($\Delta H$) from nominal writing plane 10, potentially inducing critical dimension (CD) control errors.

Figure 2:
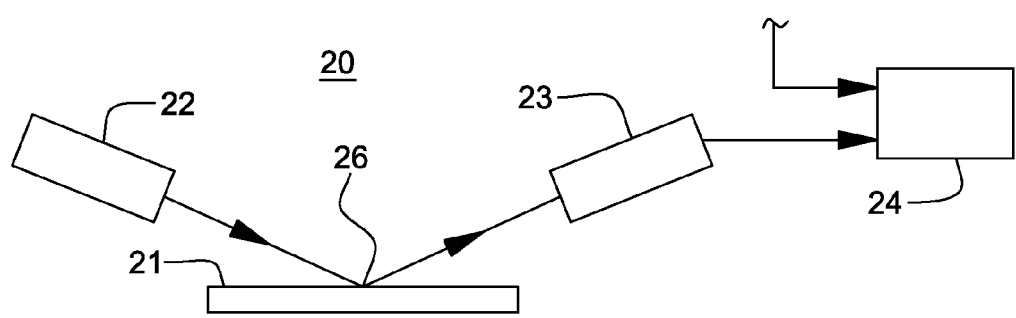
FIG. 2 is a diagram of a conventional monitoring approach for sensing height of a substrate surface within a lithography system.

FIG. 2 illustrates one embodiment of a conventional optical height sensor for an electron beam lithography system. As shown, height sensor 20 includes an optical irradiation system 22 and a position-detection system 23. The optical irradiation system projects a beam of light (e.g., a slit image) diagonally onto a measurement point within a first read-ahead region 26 of the substrate surface 21. Position-detection system 23 receives light reflected from the substrate surface and forms an image of the slit. A change in the focus position of the substrate surface laterally displaces the slit image formed by the position-detection system 23. A focus signal corresponding to the lateral displacement of the slit image is supplied by the position-detection system 23 to a focus selector 24, which makes the appropriate focus adjustment to the writing beam. The focus-detection system thus receives the reflected light from the substrate surface and calculates the height displacement of the substrate surface utilizing the position of the reflected beam. It is shown below that this simple detection design only yields accurate height displacement information when there is no tilt of the substrate surface relative to the nominal writing plane of the lithography system.

Figure 3:
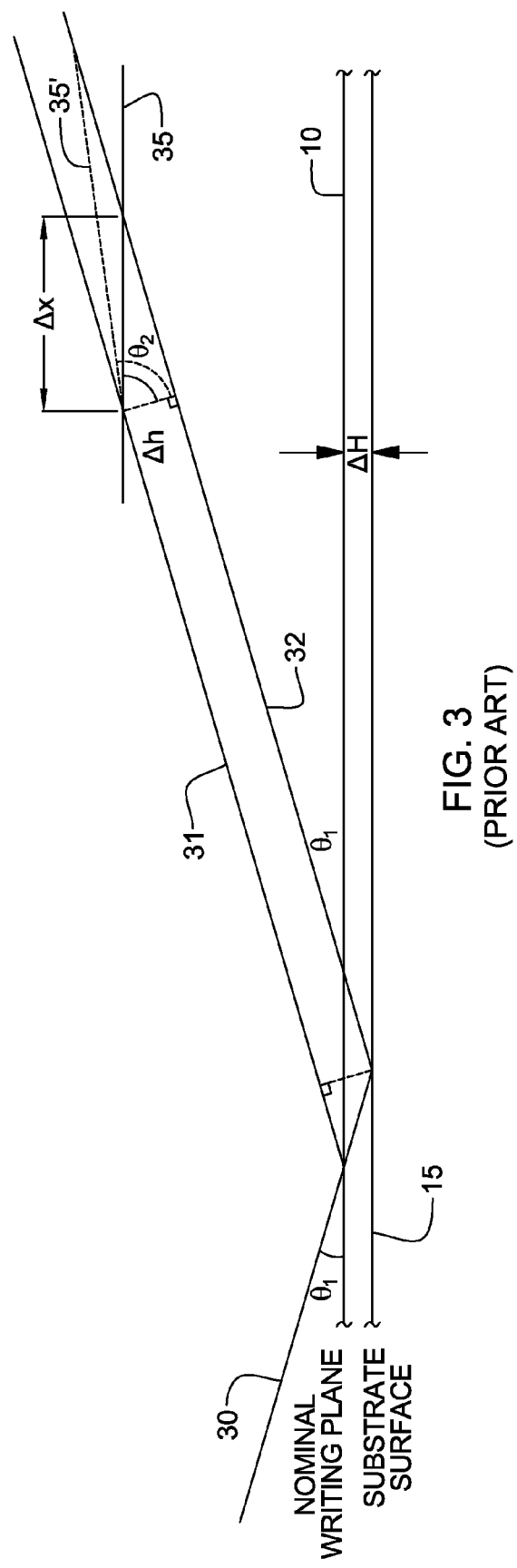
FIG. 3 illustrates a beam of light reflecting off a substrate surface positioned at the nominal writing plane of a lithography system and off a substrate surface positioned at a height offset from the nominal writing plane of the lithography system, and illustrating detection of the resultant reflected beams, in accordance with the conventional monitoring approach for determining height of the substrate surface.

FIG. 3 is a more detailed example of the conventional height monitoring approach for a lithography system, wherein substrate surface 15 (i.e., the actual writing surface or wafer) has a height difference ($\Delta H$) from the nominal (or ideal) writing surface 10 of the lithography system. For this example, it is assumed that there is no tilt to the substrate surface. The height difference ($\Delta H$) between the substrate surface and the nominal writing plane results in an offset of the reflected beams 31, 32. Specifically, a beam of light 30 impinging on nominal writing plane 10 produces a reflected beam 31, while the same beam of light 30 impinging on substrate surface 15 produces a reflected beam 32, offset from reflected beam 31. These two reflected beams 31, 32 impinge a detector plane 35 of an imaging device (such as a charge coupled device (CCD)) at different positions as illustrated.

In the following discussion, reference is made to the variables defined in Table 1 below.

TABLE 1

| Variable | Definition |
|---|---|
| $\Delta H$ | Wafer height difference from the nominal writing plane |
| $h_1$ | The height of first detector plane from the nominal writing plane |
| $h_2$ | The height of the image of the second detector plane from the nominal writing plane |
| $\Delta h$ | The displacement of the reflected beam in response to a height variance of $\Delta H$. |
| K | $K = \tan\theta_1$ |
| $\theta_1$ | The incident angle of the detection light beam |
| a | $a = \tan\theta_{x-tilt}$ |
| b | $b = \tan\theta_{y-tilt}$ |
| $\theta_{x-tilt}$ | The tilt angle of the wafer relative to nominal writing plane in x direction |
| $\theta_{y-tilt}$ | The tilt angle of the wafer relative to nominal writing plane in y direction |
| $x_1$ | x coordinate of first reflected beam portion impinging on first detector plane |
| $y_1$ | y coordinate of first reflected beam portion impinging on first detector plane |
| $z_1$ | z coordinate of first reflected beam portion impinging on first detector plane |
| $x_2$ | x coordinate of second reflected beam portion impinging on second detector plane |
| $y_2$ | y coordinate of second reflected beam portion impinging on second detector plane |
| $z_2$ | z coordinate of second reflected beam portion impinging on second detector plane |
| $x_{1,0}$ | x coordinate of first reflected beam portion impinging on first detector plane when substrate surface is at the nominal writing plane |
| $y_{1,0}$ | y coordinate of first reflected beam portion impinging on first detector plane when substrate surface is at the nominal writing plane |
| $z_{1,0}$ | z coordinate of first reflected beam portion impinging on first detector plane when substrate surface is at the nominal writing plane |

TABLE 1-continued

| Variable | Definition |
|---|---|
| $x_{2,0}$ | x coordinate of second reflected beam portion impinging on second detector plane when substrate surface is at the nominal writing plane |
| $y_{2,0}$ | y coordinate of second reflected beam portion impinging on second detector plane when substrate surface is at the nominal writing plane |
| $z_{2,0}$ | z coordinate of second reflected beam portion impinging on second detector plane when substrate surface is at the nominal writing plane |
| $P_1$ | $P_1 = \begin{pmatrix} x_1 \\ y_1 \\ z_1 \end{pmatrix}$ is the coordinates where the reflected light beam hit the detector plane |
| $P_2$ | $P_2 = \begin{pmatrix} x_2 \\ y_2 \\ z_2 \end{pmatrix}$ is the coordinates where the reflected light beam hit the image of the second detector plane |

Assuming that the detection beam forms an angle $\theta_1$ with the writing surface on the incidence plane, it is observed that offset of the reflected beam $\Delta h$ satisfies:

$$\Delta h = \frac{\Delta h}{\sin(\theta_1)} \sin(2\theta_1) = 2 \cdot \Delta H \cos\theta_1 \tag{1}$$

As shown in FIG. 3, the detection surface 35 has an angle $\theta_2$ with the normal of the reflected beams 31, 32. The positional difference ($\Delta x$) of the reflected beams 31, 32 impinging on detection surface 35 is:

$$\Delta x = \frac{\Delta h}{\cos(\theta_2)} = 2 \cdot \Delta H \frac{\cos\theta_1}{\cos\theta_2} \tag{2}$$

When detector surface 35 is horizontal and parallel to the nominal writing surface 10, $\theta_2 = 90° - \theta_1$. In this case, the positional difference ($\Delta x$) is:

$$\Delta x = 2\Delta H \frac{\cos\theta_1}{\cos\theta_1} \tag{3}$$

Note that it is desirable to have angle $\theta_2$ larger than $90° - \theta_1$ to increase the sensitivity of the height sensor. For example, it is shown in FIG. 3 that the configuration with the alternative imaging detector surface 35' yields a larger detection difference for the same height difference ($\Delta H$). Angle $\theta_2$ is thus an amplification angle, and with a larger $\theta_2$, the sensitivity of the height sensor is greater.

Figure 4:
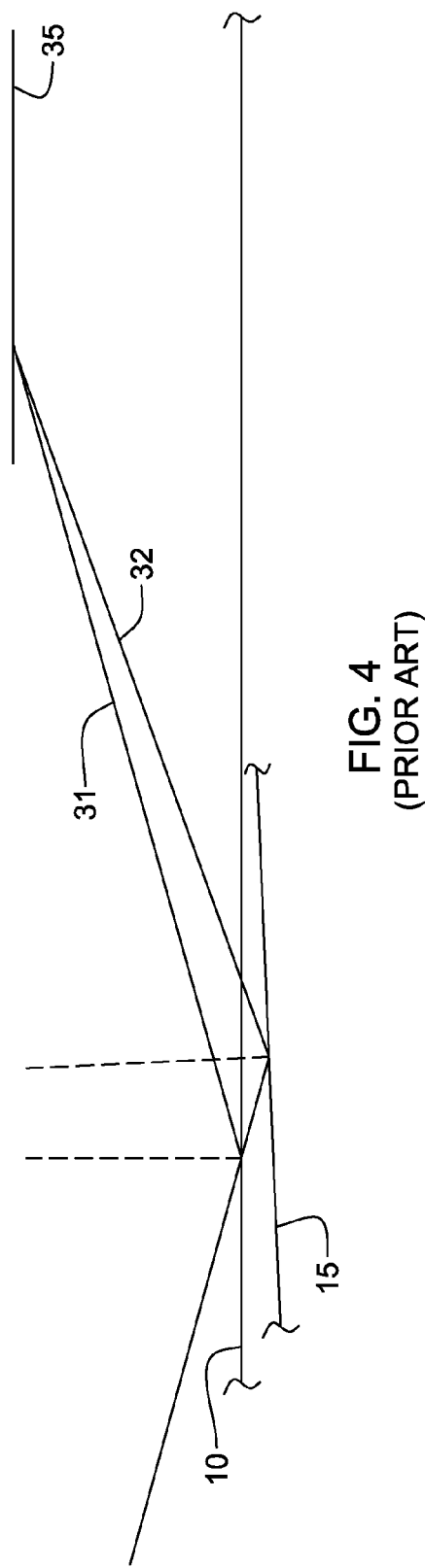
FIG. 4 further illustrates the conventional monitoring approach of FIG. 3, wherein both a height and a tilt offset of the substrate surface relative to the nominal writing plane are present.
Figure 5:
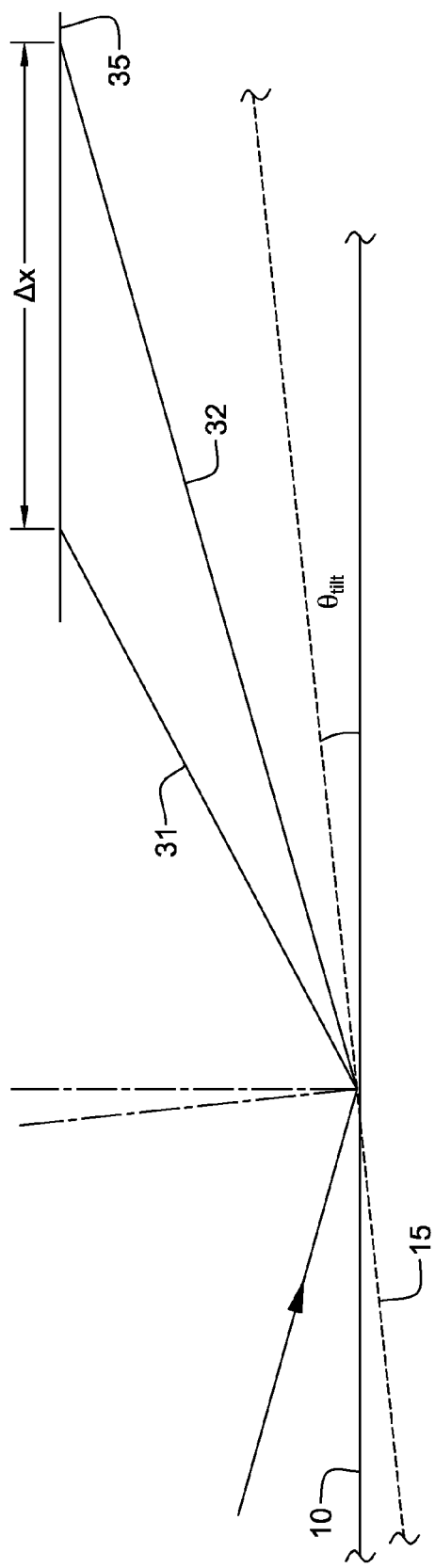
FIG. 5 illustrates a conventional monitoring approach for determining substrate surface tilt employing a beam of light impinging on the substrate surface.

When the writing surface (i.e., substrate surface) is tilted, the simple height sensor design of FIG. 2 produces inaccurate results, since the sensor is unable to differentiate a height error from a tilt error. In FIGS. 4 & 5, two special cases of this are shown. Referring first to FIG. 4, the combination of height and tilt error in substrate surface 15 relative to nominal writing plane 10 yields no difference in the impingement of the reflected beams 31, 32 onto detector surface 35, meaning that the height sensor cannot measure the height or tilt difference relative to the nominal writing plane.

In FIG. 5, substrate surface 15 has a one-directional pure tilt error relative to the nominal writing plane 10, that is, substrate surface 15 is tilted in the detection beam incidence plane at an angle of $\theta_{tilt}$ and there is no height error. In this one-directional pure tilt case, it is straightforward to determine the relationship between $\Delta x$ and $\theta_{tilt}$ as:

$$\Delta x = \frac{2h_1 \sin(\theta_1)}{\cos(\theta_1)} - \frac{2h_1 \sin(\theta_1)}{\cos(\theta_1 - \theta_{tilt})} \tag{4}$$
$$= 2h_1[\tan(\theta_1) - \sec(\theta_1 - \theta_{tilt})\sin(\theta_1)]$$

in which $h_1$ is the height of detector plane 35 from the nominal writing plane 10, and $\theta_{tilt}$ is the tilt angle of the actual writing plane (i.e., substrate surface 15) relative to the nominal writing plane 10.

Figure 6:
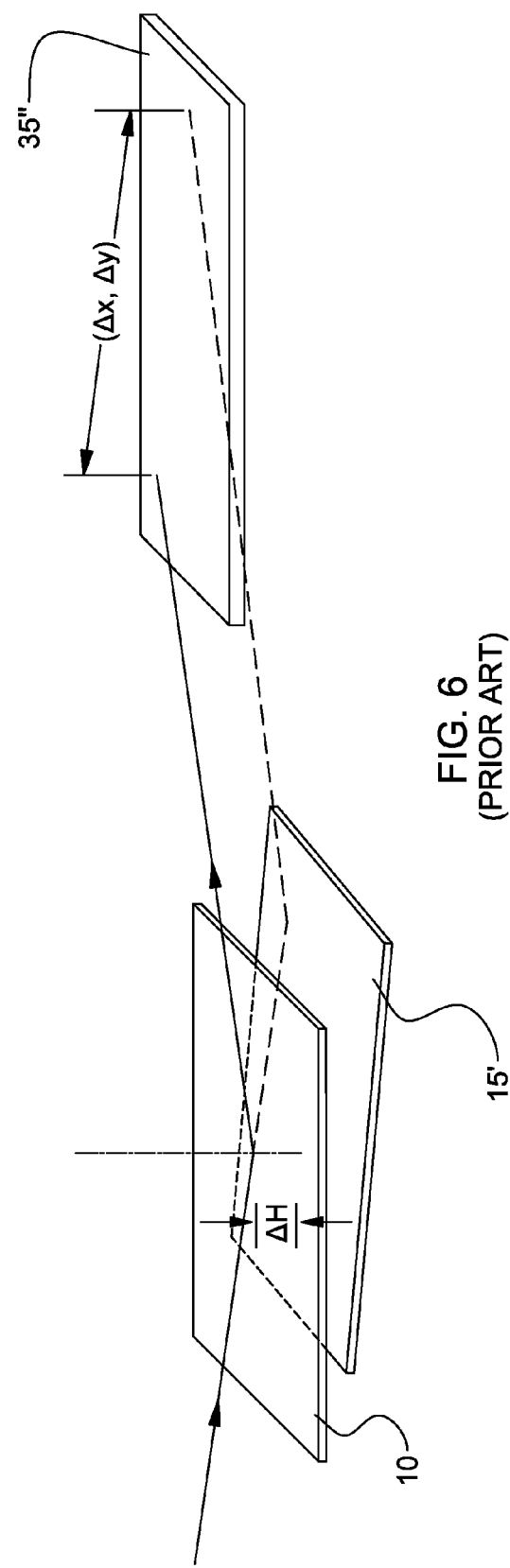
FIG. 6 illustrates a substrate surface tilt with two degrees of tilt freedom, namely, an x-tilt and a y-tilt relative to the nominal writing plane.

In practice, the tilt of the writing plane may be in two independent directions. In Cartesian coordinates, the tilt can be in both x and y directions. Together with the height difference from the nominal plane, there are therefore three degrees of freedom to be determined, which means that three independent variables are needed to describe the position of the actual writing plane relative to the nominal writing plane. However, as can be seen in FIG. 6, a two-dimensional position detector 35" gives at most two degrees of freedom ($\Delta x$, $\Delta y$), which are the positional coordinate differences on detector surface 35" of the reflected beams when the actual writing plane 15' differs from the ideal, nominal writing plane 10. It is not mathematically possible to determine these three degrees of freedom of positional information for the actual writing plane using the conventional sensing approach of FIGS. 2-6, which provides at most two degrees of freedom information.

Also, it becomes more difficult to calculate the substrate surface position using simply geometry when two independent directions of tilt are taken into account. Analytical geometry is useful for this calculation. To set up the issue, assume that the origin of the Cartesian coordinates is on the nominal writing spot. The z axis is along the writing beam axis, and it is in the height direction. The nominal writing surface is on the x-y plane (z=0 plane), and the x direction can be set on the incidence plane. Assume that the actual writing surface has a $\Delta H$ height difference from the nominal writing surface in the writing beam direction, and has both x and y direction tilt of $\theta_{x-tilt}$ and $\theta_{y-tilt}$. From this, it is known that the point $(0,0,\Delta H)$ is on this plane, and it can be expressed as the following equation:

$$z = ax + by + \Delta H \tag{5}$$

in which:

$$a = \tan(\theta_{x-tilt})$$

$$b = \tan(\theta_{y-tilt})$$

The point of origin (0,0,0) is on the incidence beam, and it can be expressed as the following parametric equations:

$$\begin{cases} x = t \\ y = 0 \\ z = -t\tan\theta_1 \end{cases} \quad (6)$$

The reflection calculation in analytical geometry can be written as:

$$\vec{R} = \vec{v} - 2(\vec{v}\cdot\vec{n})\vec{n} \quad (7)$$

in which $\vec{v}$ is the vector of the incidence beam, $\vec{n}$ is the normal vector of the reflection plane, and $\vec{R}$ is the vector of the reflected beam. In the current example, the reflection plane is the actual writing plane, expressed as equation (5), and has a normal of:

$$\hat{n} = \frac{1}{\sqrt{1+a^2+b^2}} \begin{pmatrix} a \\ b \\ -1 \end{pmatrix} \quad (8)$$

The incidence beam is expressed in equation (6), and has a vector expressed as:

$$\vec{v} = \begin{pmatrix} 1 \\ 0 \\ -\tan\theta_1 \end{pmatrix} \quad (9)$$

Putting both equations (8) and (9) into equation (7), yields the vector of the reflected beam as:

$$\vec{R} = \frac{1}{1+a^2+b^2} \begin{pmatrix} 1 - a^2 + b^2 - 2aK \\ -2b(a+K) \\ 2a + K(1-a^2-b^2) \end{pmatrix} \quad (10)$$

in which $K = \tan\theta_1$ and is used to simplify the equations.

Along with this vector, a point on the reflected beam is needed to yield the equation for the reflected beam. Note that the incidence point is on the line of the reflected beam. This point is also the line-plane intersection of the incidence beam and the actual writing surface, and its coordinates can be calculated by combining equations (5) and (6). The coordinates of the incidence point is:

$$P_0 = \left(-\frac{\Delta H}{a+K}, 0, \frac{\Delta HK}{a+K}\right) \quad (11)$$

The reflected beam is a line with the direction vector of equation (10) and passes incidence point $P_0$, expressed as equation (11). This line can be written in a parametric equation as:

$$\begin{pmatrix} x \\ y \\ z \end{pmatrix} - P_0 = t\vec{R} \quad (12)$$

Also, the detection surface is situated at height of $h_1$, and it can be expressed as:

$$z = h_1 \quad (13)$$

The detection spot is the line-plane intersection of the reflected beam and the detection surface (or plane), which can be calculated combining equations (12) and (13).

$$\begin{cases} x_1 = \frac{2\Delta H(1-aK) + h_1(a^2-b^2-1+2aK)}{K(a^2+b^2-1)-2a} \\ y_1 = -\frac{2b(ah_1 - \Delta HK + h_1 K)}{K(a^2+b^2-1)-2a} \end{cases} \quad (14)$$

It can be seen that the position of the detected spot $(x_1, y_1)$ is determined by $\Delta H$, $a = \tan\theta_{x\text{-}tilt}$, and $b = \tan\theta_{y\text{-}tilt}$, and that it is not possible to obtain these three independent pieces of information from the two equations. Stated otherwise, the substrate surface has three degrees of freedom, while the detection spot on the detector plane has only two degrees of freedom. Thus, a new design is required in order to differentiate and determine the difference in height and the tilt of the substrate surface relative to the nominal writing plane.

Figure 7:
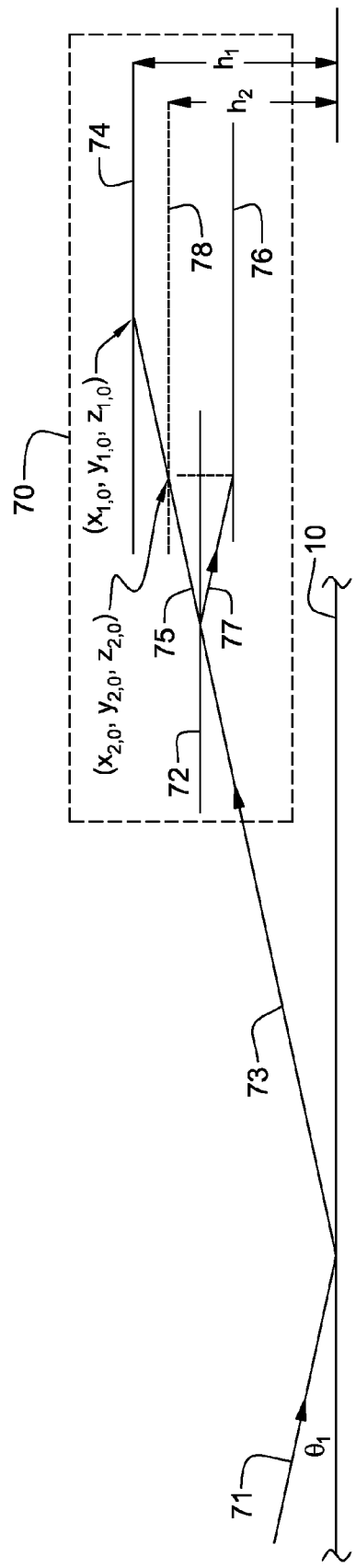
FIG. 7 illustrates one embodiment of a substrate surface monitoring approach, in accordance with an aspect of the present invention.

In order to obtain another degree of freedom from a monitor apparatus, (to evaluate tilt of the substrate surface in combination with determining height difference $\Delta H$), described hereinbelow is a monitor apparatus wherein an optical splitting device and a second optical detector are added. As illustrated in FIG. 7, height and tilt sensor 70 includes (in accordance with an aspect of the present invention) optical splitting device 72, such as an optical splitting mirror, and a first optical detector comprising a first detector plane 74 and a second optical detector comprising a second detector plane 76. As shown, during height and tilt monitoring, a beam of light 71 impinges on the substrate surface at an angle $\theta_1$ to produce a reflected beam 73. Reflected beam 73 is then optically split into at least a first reflected beam portion 75 and a second reflected beam portion 77.

In one example, the optical splitting is achieved via an optical splitter, such as an optical splitting mirror. The x,y coordinates of the center point of the first reflected beam portion and the second reflected beam portion impacting the respective first detector plane 74 and second detector plane 76 are illustrated. In this example, the "$_0$" denotes an x,y,z position obtained when the substrate surface to be patterned is on the nominal writing plane 10. To simplify the calculations, the image 78 of the second detector plane 76 about the optical splitter can be employed. As shown in FIG. 7, the x,y coordinates for the first reflected beam portion intersecting the image of the second detector plane $(x_{2,0}, y_{2,0}, z_{2,0})$ are the same coordinates as the second reflected beam portion intersecting the real second detector plane 76 of the second optical detector.

In using the image of the second detector plane, the height $h_1$ of the first detector plane relative to nominal writing surface 10 must be different from the height $h_2$ of the mirror image of the second detector plane relative to nominal writing surface 10. This requirement ensures that the two points of impingement of the respective reflected beam portions are independent. Note that although described herein as impinging the second reflected beam portion onto the second detector plane of the second optical detector, the second detector plane is mathematically equivalent to its image plane formed by the optical splitting device. Thus, the second detector plane can be analyzed by analyzing its image plane. As a further alternative, the first detector plane could be analyzed by analyzing its image plane (not shown) in combination with the second detector plane.

Effectively, two detector planes are achieved in the monitor apparatus depicted in FIG. 7. The first detector plane 74 is situated at height $h_1$, and the second detector plane 78 at height $h_2$. (Within the height and tilt sensor, the optical splitting device, and first and second detector planes are assumed to be parallel to the nominal writing plane.) The two detection points $P_1$ and $P_2$ can be expressed as:

$$P_1 = \begin{pmatrix} x_1 \\ y_1 \\ z_1 \end{pmatrix}, \text{ and } \begin{cases} x_1 = \dfrac{-2\Delta H + h_1 - 2a^2\Delta HK - 2ah_1K}{2a+K} \\ y_1 = -\dfrac{b(ah_1 - \Delta HK + h_1K)}{2a+K} \\ z_1 = h_1 \end{cases} \quad (15)$$

$$P_2 = \begin{pmatrix} x_2 \\ y_2 \\ z_2 \end{pmatrix}, \text{ and } \begin{cases} x_2 = \dfrac{-2\Delta H + h_2 - 2a^2\Delta HK - 2ah_2K}{2a+K} \\ y_2 = -\dfrac{b(ah_2 - \Delta HK + h_2K)}{2a+K} \\ z_2 = h_2 \end{cases} \quad (16)$$

When height $h_1$ is not equal to height $h_2$, four equations are obtained from equations (15) & (16), with three of the equations being independent of each other:

$$x_1 = \frac{-2\Delta H + h_1 - 2a^2\Delta HK - 2ah_1K}{2a+K} \quad (17)$$
$$y_1 = -\frac{b(ah_1 - \Delta HK + h_1K)}{2a+K}$$
$$x_2 = \frac{-2\Delta H + h_2 - 2a^2\Delta HK - 2ah_2K}{2a+K}$$
$$y_2 = -\frac{b(ah_2 - \Delta HK + h_2K)}{2a+K}$$

When locations $x_1$, $y_1$, $x_2$ & $y_2$ are obtained from the height and tilt sensor, the height difference $\Delta H$, and variables a & b can be determined from any three of the four equations (17) noted above.

In practice, relative positions instead of absolute impingement positions can be measured for the detector planes. As explained further below, when the height and tilt sensor is undergoing calibration, the support stage, with the calibration target, is measured for its height and tilt, and this state of the calibration target is set to the nominal writing plane. Specifically, when the monitor apparatus is calibrated, $\Delta H=0$, $a=0$, and $b=0$ are set in the equations. Thus, the coordinates of the detection spots on the detector planes when the nominal writing plane is being measured can be expressed as:

$$\begin{aligned} x_{10} &= \frac{h_1}{K} \\ y_{10} &= 0 \end{aligned} \quad (18)$$
$$\begin{aligned} x_{20} &= \frac{h_2}{K} \\ y_{20} &= 0 \end{aligned}$$

Figure 8:
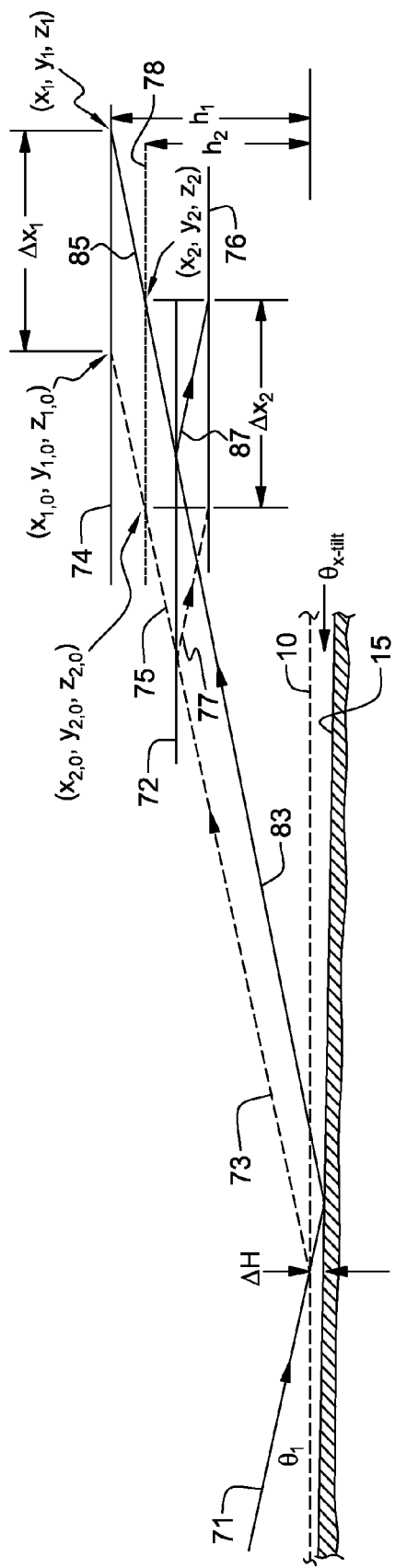
FIG. 8 depicts the monitoring approach of FIG. 7, and illustrates measurements for determining height and tilt variation of the substrate surface relative to the nominal writing plane of the lithography system, in accordance with an aspect of the present invention.

When writing to the substrate surface, the relative positions of $P_1$ and $P_2$ are measured. These relative positions are illustrated in FIG. 8, wherein the substrate surface 15 has a height and tilt difference from the nominal writing plane 10. The height and tilt differences are sensed by impinging beam of light 71 onto a point on the substrate surface to produce a reflected beam 83. Reflected beam 83 is optically split via optical splitting device 72 into at least a first reflected beam portion 85 and a second reflected beam portion 87. These respected beam portions are then impinged onto the respective detector planes 74, 76 of the first and second optical detectors. Similar impingement points for the beam of light impinging onto a writing surface at the nominal writing plane are also illustrated in FIG. 8, and are equivalent to those discussed above in connection with FIG. 7. The variables $\Delta x_1$, $\Delta x_2$ are the difference between $x_1$, $x_2$ and $x_{1,0}$, $x_{2,0}$, respectively. Variables $\Delta y_1$, $\Delta y_2$ are also similarly defined in the y direction, assuming that $\theta_{y\text{-}tilt}$ is present.

$$\Delta x_1 = -\frac{h_1}{K} + \frac{2\Delta H(1-aK) + h_1(a^2 - b^2 + 2aK - 1)}{-2a + K(a^2 + b^2 - 1)} \quad (19)$$
$$\Delta y_1 = -\frac{2b(ah_1 - \Delta HK + h_1K)}{-2a + K(a^2 + b^2 - 1)}$$
$$\Delta x_2 = -\frac{h_2}{K} + \frac{2\Delta H(1-aK) + h_2(a^2 - b^2 + 2aK - 1)}{-2a + K(a^2 + b^2 - 1)}$$
$$\Delta y_2 = -\frac{2b(ah_2 - \Delta HK + h_2K)}{-2a + K(a^2 + b^2 - 1)}$$

Equations (19) express the relationship of height variance and tilt of a substrate surface using the points of impingement on the detector planes. From detector plane measurements, $\Delta x_1$, $\Delta y_1$, $\Delta x_2$ & $\Delta y_2$ can be determined, and from these four pieces of data, it is mathematically straightforward to calculate $\Delta H$, a & b from any three of the four equations (19). These equations can be solved by either analytical or numerical methods, using known variables ($h_1$, $h_2$ & K (i.e., the incident angle tangent)).

Figure 9:
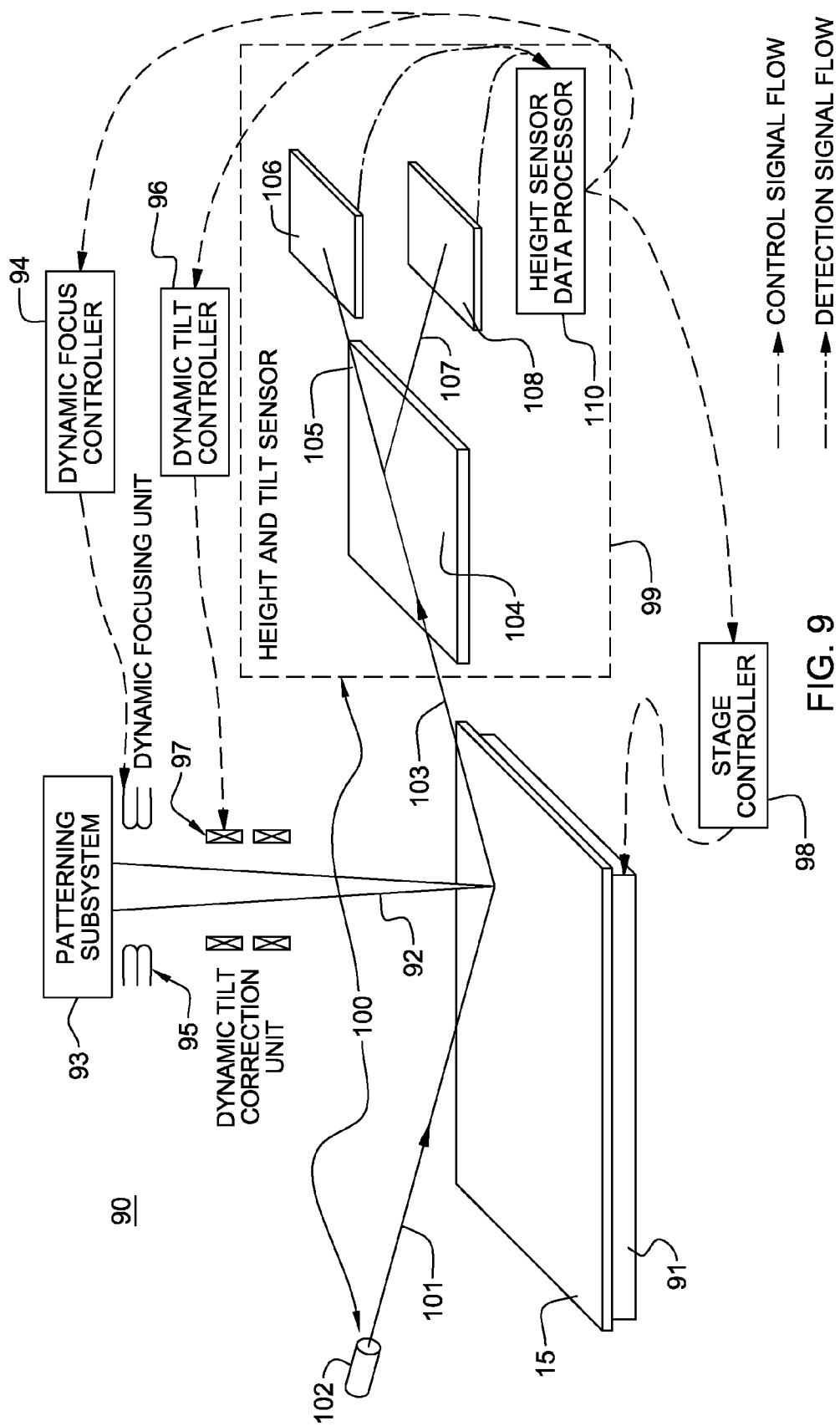
FIG. 9 depicts one embodiment of a lithography system with a monitoring height and tilt apparatus, in accordance with an aspect of the present invention.

FIG. 9 depicts one embodiment of a lithography system, generally denoted 90, employing a monitor apparatus 100, in accordance with an aspect of the present invention. Lithography system 90 includes a support stage 91 which supports a substrate having a substrate surface 15 to be written. Substrate surface 15 is exposed to a writing beam 92 produced by a patterning subsystem 93 of lithography system 90. A dynamic focus controller 94 controls via a dynamic focusing unit 95 focus of writing beam 92, and a dynamic tilt controller 96 controls via a dynamic tilt correction unit 97 the tilt of writing beam 92 relative to substrate surface 15. Additionally, a stage controller 98 is coupled to support stage 91 to control position of the substrate surface via adjustment of support stage 91.

Monitor apparatus 100 includes a detection light beam source 102 providing a beam of light 101 (e.g., a laser beam) for impingement on a point to be monitored on substrate surface 15. The reflected beam 103 of light is passed through a height and tilt sensor 99 comprising a beam splitting device 104, and a first detector plane 105 of a first optical detector and a second detector plane 106 of a second optical detector, as explained above in connection with FIGS. 7 & 8. (By way of example, suitable beam splitting devices and optical detectors are available from Edmund Optics Inc., of Barrington, N.J., Newport Corporation of Irvine, Calif., and Anchor Optics of Barrington, N.J.) Further, the height and tilt sensor 99 includes a processor 110 for processing the generated intensity data from the first reflected beam portion 105 and the second reflected beam portion 107 using, for example, the equations described above.

Figure 10:
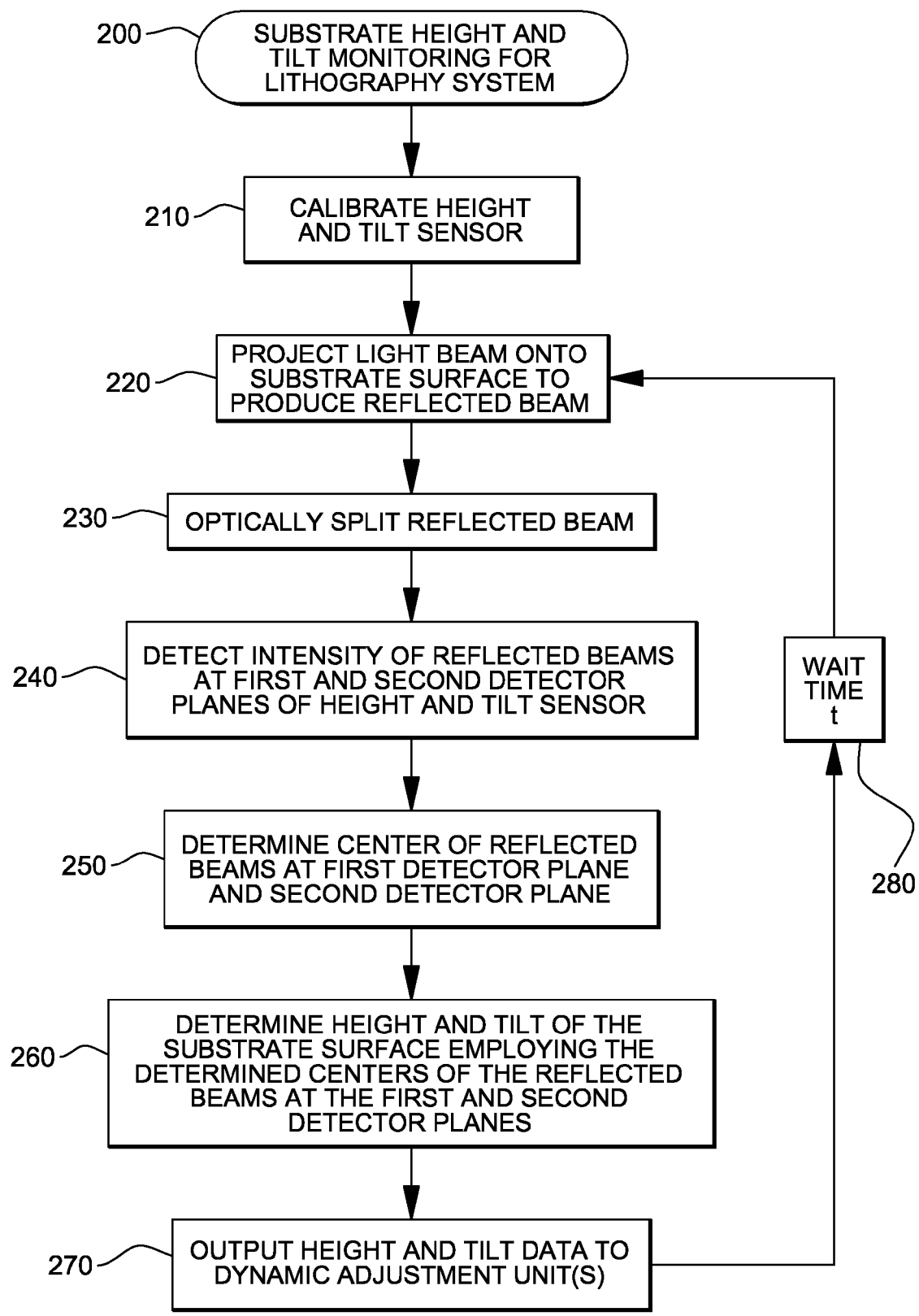
FIG. 10 is a flowchart of one process embodiment for monitoring height and tilt of a substrate surface within a lithography system, in accordance with an aspect of the present invention.
Figure 11:
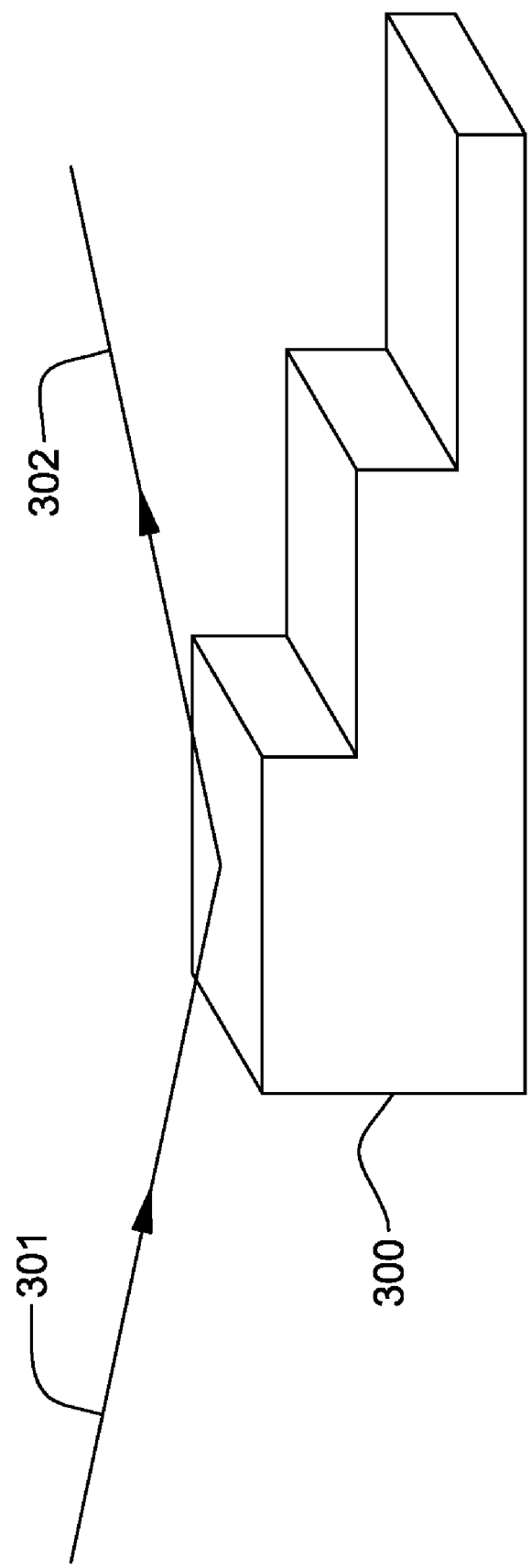
FIG. 11 depicts one embodiment of a calibration block, which facilitates calibration of the monitoring apparatus of the lithography system of FIG. 9, in accordance with an aspect of the present invention.

FIG. 10 illustrates one embodiment of processing for facilitating operation of a lithography system employing a monitor apparatus such as depicted in FIG. 9. The substrate height and tilt monitoring of the lithography system 200 begins with calibration of the height and tilt sensor 210. Calibration is needed upon installation of the height and tilt sensor into the lithography system. A calibration block 300, such as depicted in FIG. 11, may be employed during initial calibration and startup of the monitoring apparatus. The incident angle of a beam of light 301 is required for the processing, and the position of the nominal plane should also be registered. For this purpose, a known dimensional calibration block 300 can be used. One surface of calibration block 300 should be located on the nominal writing plane, and its position, i.e., both height and tilt, should be registered during the calibration using reflected beam 302. Employing the known dimensions of calibration block 300, the incident angle can also be calculated. Note that this calibration process is typically only performed after initial installation of the monitor apparatus.

Continuing with the process of FIG. 10, after calibration, a beam of light is projected onto the substrate surface to produce the reflected beam 220. This reflected beam is then optically split into at least a first reflected beam portion and a second reflected beam portion 230. Within the height and tilt sensor, the first reflected beam portion impinges onto a first detector plane of a first optical detector to generate intensity data, and the second reflected beam portion impinges onto a second detector plane of the second optical detector to generate intensity data 240.

From this intensity data, the processor of the height and tilt sensor determines the x,y location of the center point of each reflected beam portion 250. Using this information, the processor then determines the height and tilt (i.e., x-tilt and y-tilt) of the substrate employing, for example, equations (19) 260. From the determined height and tilt information, the processor outputs the height and tilt data to one or more dynamic adjustment units, such as dynamic focus controller 94, dynamic tilt controller 96 and stage controller 98 illustrated in the lithography system of FIG. 9 270. Based upon the determined height and tilt, the substrate surface and/or the writing beam is dynamically adjusted in order to maintain an in-focus image. After making the dynamic adjustment, the process may wait a time interval t 280 (e.g, to allow for movement of the substrate surface relative to the writing beam), before again projecting the beam of light onto the substrate surface for sensing height and tilt of the substrate surface. In one implementation, the beam of light is projected onto the substrate surface at a point on the substrate surface to be written or patterned by the writing beam. Alternatively, the beam of light may be projected onto a point on the substrate surface to be next written by the writing beam.

Those skilled in the art will note from the above discussion that provided herein is a novel monitoring method and apparatus for a lithography system for monitoring height and tilt variations on the substrate surface (e.g, wafer) to be written by the lithography system, and to dynamically adjust the writing process based upon the determined height and tilt information in order to maintain an in-focus pattern. Advantageously, calibration and alignment of the monitoring apparatus to a new or retrofitted, existing lithography system are readily achieved.

Aspects of the detailed description presented above are discussed in terms of program procedures executed on a processor. These procedural descriptions and representations are used by those skilled in the art to most effectively convey the substance of their work to others skilled in the art. They may be implemented in hardware or software, or a combination of the two.

A procedure is here, and generally, conceived to be a sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers, objects, attributes or the like. It should be noted, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are automatic machine operations. Useful machines for performing the operations of the present invention include general purpose digital computers or similar devices.

Each step of the processor method described may be executed on any general computer, such as a server, mainframe computer, personal computer or the like and pursuant to one or more, or a part of one or more, program modules or objects generated from any programming language, such as C++, Java, Fortran or the like. And still further, each step, or a file or object or the like implementing each step, may be executed by special purpose hardware or a circuit module designed for that purpose.

Aspects of the invention are preferably implemented in a high level procedural or object-oriented programming language to communicate with a computer. However, the inventive aspects can be implemented in assembly or machine language, if desired. In any case, the language may be a compiled or interpreted language.

Aspects of the invention may be implemented as a mechanism or a computer program product comprising a recording medium. A computer program product includes, for instance, one or more computer-usable media to store computer readable program code means or logic thereon to provide and facilitate one or more aspects of the present invention. Such a mechanism or computer program product may include, but is not limited to CD-ROMs, diskettes, tapes, hard drives, computer RAM or ROM and/or the electronic, magnetic, optical, biological or other similar embodiment of the program. Indeed, the mechanism or computer program product may include any solid or fluid transmission medium, magnetic or optical, or the like, for storing or transmitting signals readable by a machine for controlling the operation of a general or special purpose programmable computer according to the methods of the invention and/or to structural components in accordance with a system of the invention.

Aspects of the invention may also be implemented in a system. A system may comprise a computer that includes a processor and a memory device and optionally, a storage device, an output device such as a video display and/or an input device such as a keyboard or computer mouse. Moreover, a system may comprise an interconnected network of computers. Computers may equally be in stand-alone form (such as the traditional desktop personal computer) or integrated into another environment (such as a partially clustered computing environment). The system may be specially constructed for the required purposes to perform, for example, the method steps of the invention or it may comprise one or more general purpose computers as selectively activated or reconfigured by a computer program in accordance with the teachings herein stored in the computer(s). The procedures presented herein are not inherently related to a particular computing environment. The required structure for a variety of these systems will appear from the description given.

In one aspect of the present invention, an application can be deployed for performing one or more aspects of the invention. As one example, the deploying of the application comprises adapting computer infrastructure operable to perform one or more aspects of the present invention.

As a further aspect of the present invention, a computing infrastructure can be deployed comprising integrating computer-readable program code into a computing system, in which the code, in combination with the computing system, is capable of performing one or more aspects of the present invention.

As yet a further aspect of the present invention, a process for integrating computer infrastructure, comprising integrating computer-readable program code into a computer system may be provided. The computer system comprises a computer-usable medium, in which the computer-usable medium comprises one or more aspects of the present invention. The code, in combination with the computer system, is capable of performing one or more aspects of the present invention.

The capabilities of one or more aspects of the present invention can be implemented in software, firmware, hardware or some combination thereof. At least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of facilitating operation of a lithography system, the method comprising:
   directing a detection beam of light onto a substrate surface, the substrate surface being positioned within the lithography system for patterning thereof, and the detection beam of light reflecting off the substrate surface as a reflected beam, and the detection beam of light being distinct from a writing beam of the lithography system;
   optically splitting the reflected beam into at least a first reflected beam portion and a second reflected beam portion;
   impinging the first reflected beam portion onto a first detector plane of a first optical detector to generate intensity and position data therefrom, and impinging the second reflected beam portion onto a second detector plane of a second optical detector to generate intensity and position data therefrom; and
   utilizing the intensity and position data generated from the first reflected beam portion and the intensity and position data generated from the second reflected beam portion in determining height and tilt of the substrate surface relative to a nominal writing plane of the lithography system.

2. The method of claim 1, further comprising automatically employing the determined height and tilt of the substrate surface in dynamically adjusting at least one of focus or tilt of the writing beam of the lithography system or physical position of the substrate surface within the lithography system.

3. The method of claim 1, wherein the first detector plane of the first optical detector is a two-dimensional detector plane, and wherein the determining comprises automatically determining height and at least one of x-tilt or y-tilt of the substrate surface relative to the nominal writing plane.

4. The method of claim 3, wherein the second detector plane of the second optical detector is also a two-dimensional detector plane.

5. The method of claim 3, wherein the automatically determining comprises automatically determining height of the substrate surface relative to the nominal writing plane, x-tilt of the substrate surface relative to the nominal writing plane, and y-tilt of the substrate surface relative to the nominal writing plane.

6. The method of claim 1, wherein the directing comprises directing the detection beam of light to a point on the substrate surface to undergo patterning by the writing beam of the lithography system.

7. The method of claim 1, wherein the optically splitting comprises passing the reflected beam through an optical splitting device to produce the first reflected beam portion and the second reflected beam portion.

8. A method of facilitating operation of a lithography system, the method comprising:
   directing a beam of light onto a substrate surface, the substrate surface being positioned within the lithography system for patterning thereof, and the beam of light reflecting off the substrate surface as a reflected beam;
   optically splitting the reflected beam into at least a first reflected beam portion and a second reflected beam portion;
   impinging the first reflected beam portion onto a first detector plane of a first optical detector to generate intensity data therefrom, and impinging the second reflected beam portion onto a second detector plane of a second optical detector to generate intensity data therefrom;
   utilizing the intensity data generated from the first reflected beam portion and the intensity data generated from the second reflected beam portion in determining at least one of height or tilt of the substrate surface relative to a nominal writing plane of the lithography system; and
   wherein the first detector plane and the second detector plane are each a two-dimensional detector plane, and the determining comprises determining an x,y location of a center point of the first reflected beam portion impinging on the first detector plane and determining an x,y location of a center point of the second reflected beam portion impinging on the second detector plane, and utilizing the determined x,y location of the center point of the first reflected beam portion impinging on the first detector plane and the determined x,y location of the center point of the second reflected beam portion impinging on the second detector plane in determining height and tilt of the substrate surface relative to the normal writing plane of the lithography system.

9. A monitoring apparatus for a lithography system, the monitoring apparatus comprising:
   an optical beam splitter positioned to optically split a reflected beam reflecting off a substrate surface positioned within the lithography system, the reflected beam being produced by a detection beam of light reflecting off the substrate surface, and wherein the optical beam splitter splits the reflected beam into at least a first reflected beam portion and a second reflected beam portion, and the detection beam of light is distinct from a writing beam of the lithography system;

a first optical detector and a second optical detector, the first reflected beam portion impinging onto a first detector plane of the first optical detector to generate intensity and position data therefrom, and the second reflected beam portion impinging onto a second detector plane of the second optical detector to generate intensity and position data therefrom; and a processor coupled to the first optical detector and the second optical detector for receiving the intensity and position data generated from the first reflected beam portion and the intensity and position data generated from the second reflected beam portion, and for determining therefrom height and tilt of the substrate surface relative to a nominal writing plane of the lithography system.

10. The monitoring apparatus of claim 9, wherein the lithography system further comprises at least one of a dynamic focus controller for dynamically controlling focus of the writing beam of the lithography system, a dynamic tilt controller for dynamically controlling tilt of the writing beam of the lithography system, or a stage controller for dynamically controlling physical position of the substrate surface within the lithography system, and wherein the processor is coupled to the at least one of the dynamic focus controller, dynamic tilt controller or stage controller for dynamically adjusting at least one of focus or tilt of the writing beam of the lithography system or physical position of the substrate surface within the lithography system responsive to the determined height or tilt of the substrate surface relative to the nominal writing plane of the lithography system.

11. The monitoring apparatus of claim 9, wherein the first detector plane of the first optical detector is a two-dimensional detector plane, and wherein the processor automatically determines height and at least one of x-tilt or y-tilt of the substrate surface relative to the nominal writing plane.

12. The monitoring apparatus of claim 11, wherein the second detector plane of the second optical detector is also a two-dimensional detector plane, and wherein the processor automatically determines height of the substrate surface relative to the nominal writing plane, x-tilt of the substrate surface relative to the nominal writing plane, and y-tilt of the substrate surface relative to the nominal writing plane.

13. The monitoring apparatus of claim 9, further comprising a light beam source directing the detection beam of light to a point on the substrate surface to undergo patterning by the writing beam of the lithography system.

14. The monitoring apparatus of claim 9, wherein the first detector plane and the second detector plane are each a two-dimensional detector plane, and wherein the processor automatically determines an x,y location of a center point of the first reflected beam portion impinging on the first detector plane and automatically determines an x,y location of a center point of the second reflected beam portion impinging on the second detector plane, and utilizes the determined x,y location of the center point of the first reflected beam portion impinging on the first detector plane and the determined x,y location of the center point of the second reflected beam portion impinging on the second detector plane in automatically determining height and tilt of the substrate surface relative to the nominal writing plane of the lithography system, and wherein the lithography system further comprises at least one of a dynamic focus controller for dynamically controlling focus of the writing beam of the lithography system, a dynamic tilt controller for dynamically controlling tilt of the writing beam of the lithography system, or a stage controller for dynamically controlling physical position of the substrate surface within the lithography system, and wherein the processor is coupled to the at least one dynamic focus controller, dynamic tilt controller or stage controller for dynamically adjusting at least one of focus or tilt of the writing beam of the lithography system or physical position of the substrate surface within the lithography system responsive to the determined height and tilt of the substrate surface relative to the nominal writing plane of the lithography system.

15. A lithography system comprising:

a patterning subsystem to project a writing beam onto a substrate for patterning thereof;

a support stage configured to support the substrate with the substrate surface thereof exposed to the writing beam; and a monitoring apparatus for monitoring at least one of height or tilt of the substrate surface relative to a nominal writing plane of the lithography system, the monitoring apparatus comprising:

an optical beam splitter positioned to optically split a reflected beam reflecting off the substrate surface, the reflected beam being produced by a detection beam of light reflecting off the substrate surface, and wherein the optical beam splitter splits the reflected beam into at least a first reflected beam portion and a second reflected beam portion, and the detection beam of light is distinct from the writing beam;

a first optical detector and a second optical detector, the first reflected beam portion impinging onto a first detector plane of the first optical detector to generate intensity and position data therefrom, and the second reflected beam portion impinging onto a second detector plane of the second optical detector to generate intensity and position data therefrom; and a processor coupled to the first optical detector and the second optical detector for receiving the intensity and position data generated from the first reflected beam portion and the intensity and position data generated from the second reflected beam portion, and for determining therefrom height and tilt of the substrate surface relative to a nominal writing plane of the lithography system.

16. The lithography system of claim 15, wherein the lithography system further comprises at least one of a dynamic focus controller for dynamically controlling focus of the writing beam of the lithography system, a dynamic tilt controller for dynamically controlling tilt of the writing beam of the lithography system, or a stage controller for dynamically controlling physical position of the substrate surface within the lithography system, and wherein the processor of the monitoring apparatus is coupled to the at least one dynamic focus controller, dynamic tilt controller or stage controller for dynamically adjusting at least one of focus or tilt of the writing beam of the lithography system or physical position of the substrate surface within the lithography system, responsive to the determined height or tilt of the substrate surface relative to the nominal writing plane of the lithography system.

17. The lithography system of claim 15, wherein the first detector plane of the first optical detector is a two-dimensional detector plane, and wherein the processor automatically determines height and at least one of x-tilt or y-tilt of the substrate surface relative to the nominal writing plane.

18. The lithography system of claim 17, wherein the second detector plane of the second optical detector is also a two-dimensional detector plane, and wherein the processor automatically determines height of the substrate surface relative to the nominal writing plane, x-tilt of the substrate surface relative to the nominal writing plane, and y-tilt of the substrate surface relative to the nominal writing plane.

19. The lithography system of claim 15, wherein the first detector plane and the second detector plane are each a two-dimensional detector plane, and wherein the processor automatically determines an x,y location of a center point of the first reflected beam portion impinging on the first detector plane and automatically determines an x,y location of a center point of the second reflected beam portion impinging on the second detector plane, and utilizes the determined x,y location of the center point of the first reflected beam portion impinging on the first detector plane and the determined x,y location of the center point of the second reflected beam portion impinging on the second detector plane in automatically determining height and tilt of the substrate surface relative to the nominal writing plane of the lithography system, and wherein the lithography system further comprises at least one of a dynamic focus controller for dynamically controlling focus of the writing beam of the lithography system, a dynamic tilt controller for dynamically controlling tilt of the writing beam of the lithography system, or a stage controller for dynamically controlling physical position of the substrate surface within the lithography system, and wherein the processor is coupled to the at least one dynamic focus controller, dynamic tilt controller or stage controller for dynamically adjusting at least one of focus or tilt of the writing beam of the lithography system or physical position of the substrate surface within the lithography system responsive to the determined height and tilt of the substrate surface relative to the nominal writing plane of the lithography system.

* * * * *